(12) United States Patent
Backman et al.

(10) Patent No.: US 11,257,636 B2
(45) Date of Patent: Feb. 22, 2022

(54) SYNCHRONIZED OPENING OF CIRCUIT BREAKER

(71) Applicant: ABB Schweiz AG, Baden (CH)

(72) Inventors: Magnus Backman, Västerås (SE); Elisabeth Lindell, Västerås (SE); Andrea Bianco, Sesto San Giovanni (IT)

(73) Assignee: ABB Schweiz AG, Baden (CH)

( * ) Notice: Subject to any disclaimer, the term of this patent is extended or adjusted under 35 U.S.C. 154(b) by 70 days.

(21) Appl. No.: 16/803,165

(22) Filed: Feb. 27, 2020

(65) Prior Publication Data

US 2020/0328039 A1    Oct. 15, 2020

(30) Foreign Application Priority Data

Apr. 12, 2019   (EP) ..................... 19169064

(51) Int. Cl.
*H01H 9/56* (2006.01)
*H01H 33/59* (2006.01)
*H02H 3/02* (2006.01)

(52) U.S. Cl.
CPC .......... *H01H 9/563* (2013.01); *H01H 33/593* (2013.01); *H01H 2009/566* (2013.01); *H02H 3/021* (2013.01)

(58) Field of Classification Search
CPC .... H01H 9/56; H01H 9/563; H01H 2009/566; H01H 7/16; H01H 33/44; H01H 33/59;
(Continued)

(56) References Cited

U.S. PATENT DOCUMENTS 5,361,184 A    11/1994   El-Sharkawi et al.
5,563,459 A    10/1996   Kurosawa et al.
(Continued)

FOREIGN PATENT DOCUMENTS

CN    103336474 A    10/2013
EP    1928007 A1    6/2008
WO   WO-2019229637 A1 * 12/2019  ............... H01H 7/16

OTHER PUBLICATIONS

European Search Report Application No. EP 19 16 9064 Completed: Sep. 5, 2019; dated Sep. 13, 2019 7 pages.

*Primary Examiner* — Harry R Behm
(74) *Attorney, Agent, or Firm* — Whitmyer IP Group LLC

(57) ABSTRACT

A method for synchronizing opening of a circuit breaker is presented. The circuit breaker is arranged to interrupt a current to an inductive load. The method is performed in a control device (2) and comprises measuring (S100) a reference signal as a function of time for a circuit breaker (1) connected to an inductive load (5), obtaining (S110) an indication of a power factor of the inductive load through the circuit breaker, determining (S120) an arcing time for opening of the circuit breaker, the arcing time being dependent on the obtained indication of a power factor, predicting (S130) a zero crossing of a current through the circuit breaker based on the measured reference signal, and providing (S140) contact separation of a contact pair of the circuit breaker at a point of time before the predicted zero crossing, the point of time being determined by the determined arcing time and the predicted zero crossing. A control device, a circuit breaker arrangement, and a computer program for synchronizing opening of a circuit breaker are also presented.

19 Claims, 4 Drawing Sheets

(58) Field of Classification Search
CPC . H01H 33/593; H01H 2009/307; H02H 3/021
See application file for complete search history.

(56) References Cited

U.S. PATENT DOCUMENTS

| | | | | |
|---|---|---|---|---|
| 5,606,249 | A * | 2/1997 | Elms | G01R 19/25 |
| | | | | 324/115 |
| 5,644,463 | A * | 7/1997 | El-Sharkawi | H01H 9/56 |
| | | | | 361/2 |
| 2008/0232005 | A1 | 9/2008 | Kuehnle et al. | |
| 2012/0285806 | A1* | 11/2012 | Boffelli | H01H 9/56 |
| | | | | 200/48 R |
| 2013/0199905 | A1* | 8/2013 | Noda | H01B 1/02 |
| | | | | 200/265 |
| 2013/0297255 | A1 | 11/2013 | Kobayashi et al. | |
| 2014/0319932 | A1 | 10/2014 | Russell et al. | |
| 2017/0104327 | A1* | 4/2017 | Nojima | H03K 17/72 |
| 2017/0150556 | A1* | 5/2017 | Hartmann | H05B 7/148 |

* cited by examiner

SYNCHRONIZED OPENING OF CIRCUIT BREAKER

TECHNICAL FIELD

The present disclosure relates to a method, a control device, a circuit breaker, and a computer program for synchronizing opening of a circuit breaker.

BACKGROUND

Circuit breakers in medium voltage systems are today most often not synchronized with respect to a phase angle of a voltage or current of the voltage system at closing or opening. Synchronization methods however exist per se and are commonly used in high voltage systems. If synchronization is used at opening, it is common to target an arcing time that should be long enough to ensure that when the arc is extinguished it does not reignite. It should not be longer than necessary though, as that would cause excessive contact wear.

CN 103336474 describes a vacuum circuit breaker permanent magnet mechanism.

SUMMARY

One objective is to minimize contact wear of circuit breakers.

According to a first aspect there is presented a method for synchronizing opening of a circuit breaker. The circuit breaker is arranged to interrupt a current to an inductive load. The method is performed in a control device and comprises measuring a reference signal as a function of time for a circuit breaker connected to an inductive load, obtaining an indication of a power factor of the inductive load through the circuit breaker, determining an arcing time for opening of the circuit breaker, the arcing time being dependent on the obtained indication of a power factor, predicting a zero crossing of a current through the circuit breaker based on the measured reference signal, and providing contact separation of a contact pair of the circuit breaker at a point of time before the predicted zero crossing. The point of time is determined by the determined arcing time and the predicted zero crossing.

By the presented method, contact wear of circuit breakers is minimized due to optimization of the arcing time to avoid reigniting the arc after it has been extinguished without making the arcing time longer than necessary.

The arcing time may be determined to be shorter for a higher power factor and longer for a lower power factor.

The reference signal may be a current through the circuit breaker.

The power factor may be obtained by measuring a current through the circuit breaker and measuring a phase-to-ground or phase-to-phase voltage at the circuit breaker. When the phase-to-phase voltage is measured, the phase angle of the phase-to-ground voltage is calculated based on the phase-to-phase voltage, in order to enable calculation of the power factor.

The reference signal may be a phase-to-ground or phase-to-phase voltage at the circuit breaker, and a value of the power factor may be predetermined.

The reference signal may be measured upstream the circuit breaker. Alternatively, the reference signal may be measured downstream the circuit breaker.

The circuit breaker may be configured for a medium voltage system.

The circuit breaker may be configured for an arc-furnace. The circuit breaker may be a vacuum circuit breaker.

The arcing time may be determined to be $t_0(1-pf)^{1/3}$ where $pf$ is the value of the power factor and $t_0$ is the value of the arcing time for the power factor equal to zero (purely inductive load). The values of $t_0$ may be in the range of 3 ms to 7 ms.

The arcing time may be determined to be at least 1 ms.

According to a second aspect, there is presented a control device for synchronizing opening of a circuit breaker arranged to interrupt a current to an inductive load. The control device comprises a processor and a computer program product storing instructions that, when executed by the processor, causes the control device to measure a reference signal as a function of time for a circuit breaker connected to an inductive load, obtain an indication of a power factor of the inductive load through the circuit breaker, determine an arcing time for opening of the circuit breaker, the arcing time being dependent on the obtained indication of a power factor, predict a zero crossing of a current through the circuit breaker based on the measured reference signal, and to provide contact separation of a contact pair of the circuit breaker at a point of time before the predicted zero crossing. The point of time is determined by the determined arcing time and the predicted zero crossing.

According to a third aspect there is presented a circuit breaker arrangement for synchronizing opening of a circuit breaker. The circuit breaker arrangement comprises a circuit breaker configured to interrupt a current to an inductive load connected to the circuit breaker, and a control device configured to control the circuit breaker.

According to a fourth aspect there is presented a computer program for synchronizing opening of a circuit breaker arranged to interrupt a current to an inductive load. The computer program comprises computer program code which, when run in a control device, causes the control device to measure a reference signal as a function of time for a circuit breaker connected to an inductive load, obtain an indication of a power factor of the inductive load through the circuit breaker, determine an arcing time for opening of the circuit breaker, the arcing time being dependent on the obtained indication of a power factor, predict a zero crossing of a current though the circuit breaker based on the measured reference signal, and to provide contact separation of a contact pair of the circuit breaker at a point of time before the predicted zero crossing. The point of time is determined by the determined arcing time and the predicted zero crossing.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

Aspects and embodiments are now described, by way of example, with reference to the accompanying drawings, in which.

DETAILED DESCRIPTION

The aspects of the present disclosure will now be described more fully hereinafter with reference to the accompanying drawings, in which certain embodiments of the invention are shown.

These aspects may, however, be embodied in many different forms and should not be construed as limiting; rather, these embodiments are provided by way of example so that this disclosure will be thorough and complete, and to fully convey the scope of all aspects of invention to those skilled in the art. Like numbers refer to like elements throughout the description.

Circuit breakers in medium voltage systems are generally not synchronized due to additional costs for adding synchronization capacity. However, there exist some applications where the frequency of operation is extremely high, such as in arc furnaces, and contact wear due to unnecessary arcing is much more problematic. In arc furnaces circuit breakers can be switched up to 100 times per day.

Further, contact wear of circuit breakers are higher the more inductive a load thereof is. Inductive loads may be more or less inductive, which is defined by the power factor of the load. A power factor of 1.0 corresponds to a completely resistive load, and 0.0 corresponds to a completely inductive load. The arcing time of a circuit breaker connected to an inductive load is herein optimized with respect to the power factor of the load, when an opening operation is to be performed by the circuit breaker.

Figure 1:
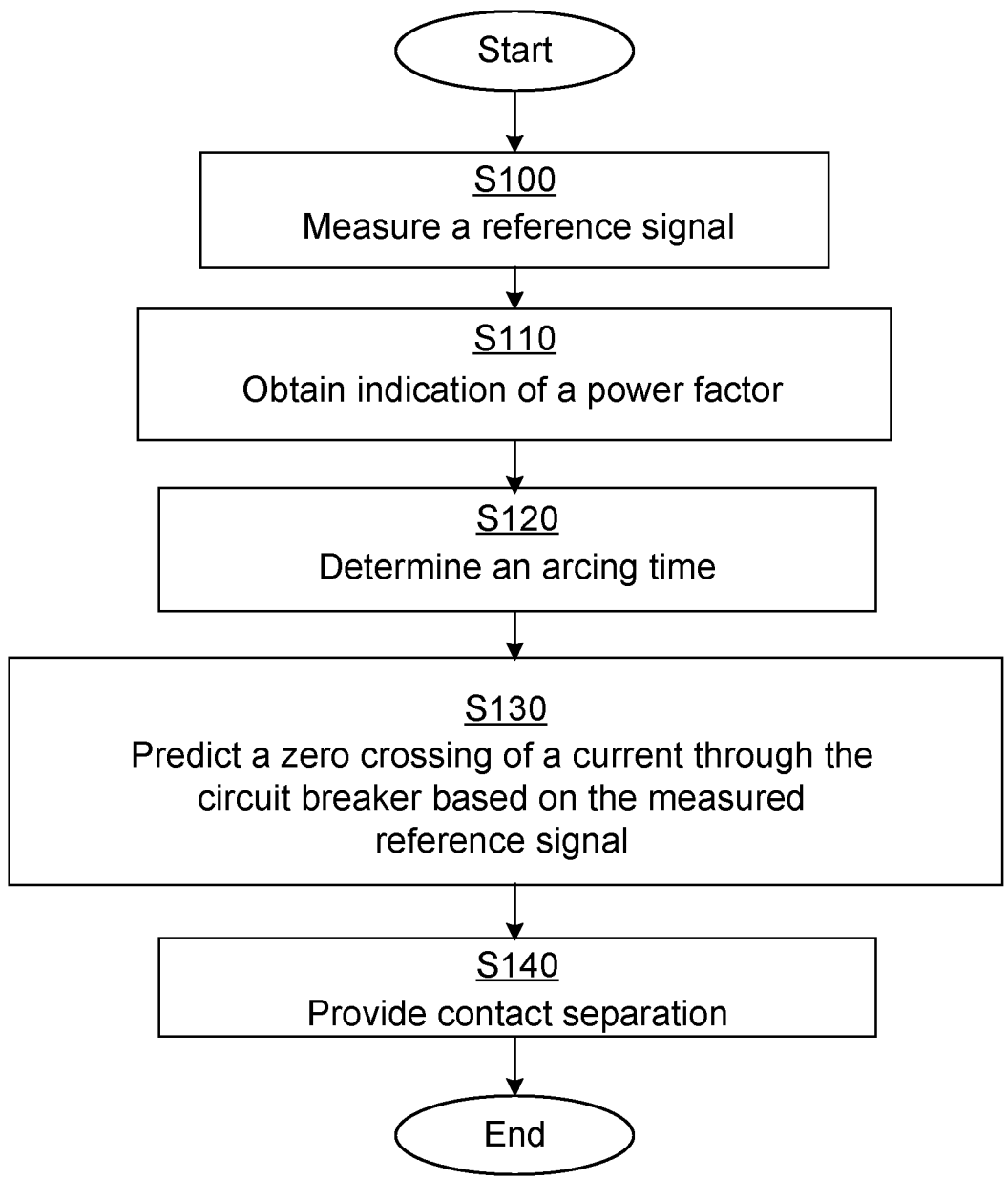
FIG. 1 is a flow chart illustrating a method according to an embodiment presented herein.

According to an aspect an embodiment of a method for synchronizing opening of a circuit breaker is presented with reference to FIG. 1. The circuit breaker is arranged to interrupt a current to an inductive load. The method is performed in a control device 2. In processing block S100 the control device measures a reference signal as a function of time for a circuit breaker 1 connected to an inductive load 5. In processing block S110 the control device obtains an indication of a power factor of the inductive load through the circuit breaker. In processing block S120 the control device determines an arcing time for opening of the circuit breaker, the arcing time being dependent on the obtained indication of a power factor. In processing block S130 the control device predicts a zero crossing of a current through the circuit breaker based on the measured reference signal. In processing block S140 the control device provides contact separation of a contact pair of the circuit breaker at a point of time before the predicted zero crossing, the point of time is determined by the determined arcing time and the predicted zero crossing.

The arcing time may be determined to be shorter for a higher power factor and longer for a lower power factor.

The reference signal may be a current through the circuit breaker.

The power factor may be obtained by measuring a current through the circuit breaker and measuring a phase-to-ground or phase-to-phase voltage at the circuit breaker. The power factor can be calculated as the cosine of the phase angle between the measured current and the measured phase-to-ground voltage. When the phase-to-phase voltage is calculated, the phase angle of the phase-to-ground voltage is calculated based on the phase-to-phase voltage, in order to enable calculation of the power factor.

The reference signal may be a phase-to-ground or phase-to-phase voltage at the circuit breaker, and a value of the power factor is then predetermined.

The reference signal may be measured upstream the circuit breaker.

The reference signal may be measured downstream the circuit breaker.

The circuit breaker may be configured for a medium voltage system.

The circuit breaker may be configured for an arc-furnace.

The circuit breaker may be a vacuum circuit breaker.

The arcing time may be determined to be at least 1 ms.

The arcing time may be determined to be $t_0(1-pf)^{1/3}$, where pf is the value of the power factor, and $t_0$ is value of the arcing time for the power factor equal to zero (a purely inductive load). $t_0$ may be in the range of 3 ms to 7 ms. $t_0$ may be at least 1 ms.

The operations shown in FIG. 1 will now be illustrated and described in more detail in conjunction with FIGS. 2-5.

Tests have been made for a non-synchronized circuit breaker, wherein it has been found that when the power factor of the load was low, the probability of reigniting an arc was higher than when the power factor was high. A targeted arcing time should thus be longer for low power factors and shorter for high power factors. In this way, reigniting an arc can be avoided without causing more contact wear than necessary.

The targeted arcing time of a circuit breaker is shortest for a power factor of 1 and increases as the power factor decreases, i.e. the more inductive the load is.

To minimize contact wear for the circuit breaker, the arcing time may be optimized in the following two ways. The most flexible one, which provides full flexibility in determining which arcing time to target as a function of power factor, relies on measurement of both voltage and current at the circuit breaker. At each circuit breaker opening operation the power factor of the power through the circuit breaker is calculated and a value of a targeted arcing time is chosen accordingly. Another method, which will still achieve the goal of a longer arcing time at lower power factors, but not fully flexible in how to optimize the relation between power factor and targeted arcing time, relies on only measuring the phase-to-ground or phase-to-phase voltage at the circuit breaker. If contact separation during opening of the circuit breaker is always related to a certain phase angle of the phase-to-ground voltage, the arcing time will automatically be smallest for a power factor equal to one, and larger for lower values of power factor. The relation between targeted arcing time and power factor can then not be affected but it will automatically exhibit a dependence which is close to the desired one. When the phase-to-phase voltage is measured, the phase angle of the phase-to-ground voltage of the relevant phase needs to be calculated. The phase-to-ground voltage is obtained through the well-known relationship u12=u1−u2 where u12 is a phase-to-phase voltage and u1 and u2 are phase to ground voltages. This gives a phase displacement where u1 is leading u12 by 30 degrees and u2 is lagging u12 by 30 degrees.

Figure 2:
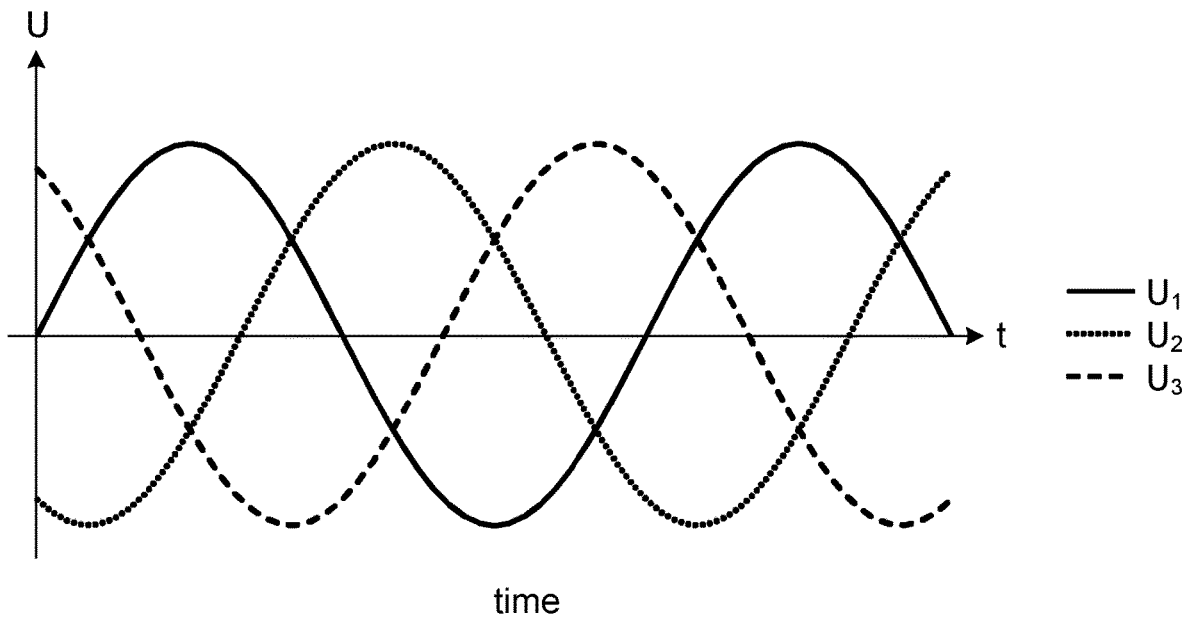
FIG. 2 is a schematic diagram illustrating three AC voltages in a three-phase system.

FIG. 2 schematically illustrates how the voltages in a three-phase AC-system are related to each other. The load currents in the respective phases will be related to each other in a corresponding way, when the load is symmetric. A circuit breaker for a three-phase AC-system has three poles, one for each phase of the system the circuit breaker is connected to. In each pole there is a contact pair which is opened when the circuit breaker is opened. It has been described how at least one contact pair of a circuit breaker has been opened in a synchronized manner. The presented method may be applied on each respective contact pair of a circuit breaker, wherein the least wear is achieved. Alternatively, a first contact pair is opened according to the presented method and each of the other two contact pairs may be delayed a quarter period (in a non-earthed system) or a third or two third period, respectively (in an earthed system). This will also give least wear when the load is completely symmetrical, otherwise the wear might be somewhat altered. Alternatively, only the first contact pair may be opened according to the presented method and the two other contact pairs may be opened simultaneously with the first pole. This will entail a longer arcing time for the other two poles, without reigniting an arc but with increased wear.

A three-pole circuit breaker is typically used in a three-phase system. Three one-pole circuit breakers may alternatively be used in a three-phase system. Opening of the three one-pole circuit breakers in a three-phase system may be controlled in the same way as a corresponding three-pole circuit breaker.

In order to minimize wear on a circuit breaker, the first step is to synchronize opening of the circuit breaker to a zero crossing of the current there through, and more precisely to synchronize contact separation of a contact pair of the circuit breaker to current interruption of the current there through. By synchronization a non-zero difference in time between contact separation and current interruption is selected. A reference signal of the circuit breaker is for synchronization purpose measured to predict when a zero crossing of the current is expected, and a certain delay time is added to a reference time instant of the reference signal before an opening command is issued to the circuit breaker, in order to obtain a desired arcing time. The arcing time is defined as the time from contact separation occurs until current interruption occurs at a current zero crossing. During opening of the circuit breaker, the reference signal can be either the phase-to-ground voltage or the phase-to-phase voltage at the circuit breaker or the current through the circuit breaker. By increasing the arcing time at lower power factors, opening may always be performed without using longer arcing time than necessary and thus causing excessive contact wear.

Circuit breakers having a motor drive, such as the VD4-AF, exhibit very precise contact movements, and therefore, targeted arcing times can be set very precisely. Other circuit breakers may exhibit larger spread in contact movement from operation to operation. Therefore, targeted arcing times should for such applications be associated with larger margins. For all synchronized circuit breakers however, the principle of targeting a longer arcing time at lower power factors is presented.

Opening of the circuit breaker may be performed such that contact separation occurs at a phase angle generating an arcing time long enough to avoid reigniting the arc.

Opening of the circuit breaker will initially provide contact separation of the contact pairs of the circuit breaker (one contact pair for each phase of the circuit breaker), which will ignite an arc if the current is above a current chopping level. There will be a short period of time elapsing from the instant when an open command is issued to a circuit breaker until the instant when the contact pair thereof separates. It is not until contact separation occurs that the arc will ignite. If the current is below a current chopping level, the current will be interrupted immediately. An ignited arc will be interrupted thereafter at a next current zero crossing of the current through the circuit breaker, or more precisely shortly prior to the current zero crossing when current interruption occurs. The time from contact separation until current interruption is defined as the arcing time. Contact separation, arcing time, and current interruption are illustrated with two examples in FIGS. 3 and 4.

Figure 3:
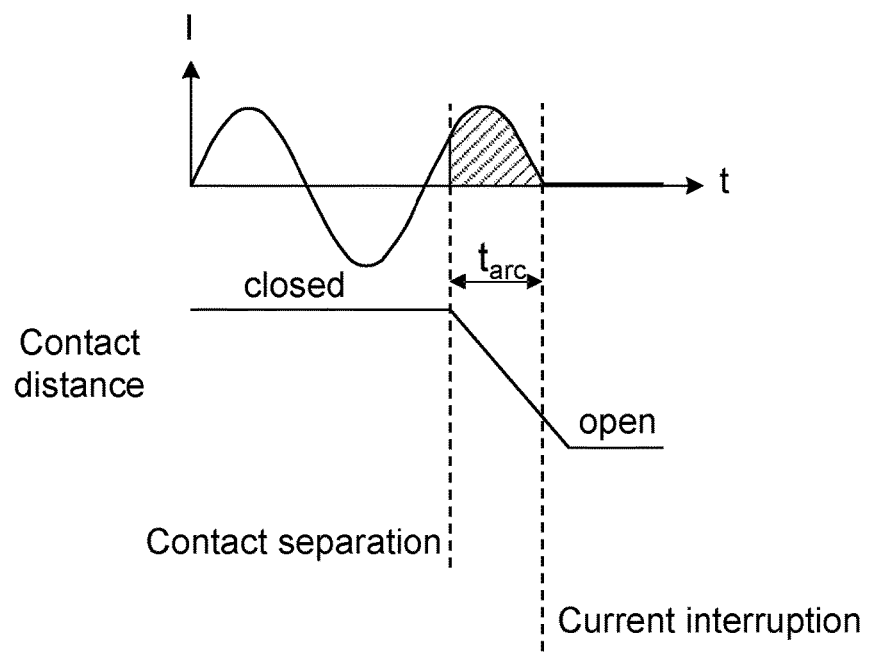
FIGS. 3 and 4 are schematic diagrams illustrating arcing times during opening of a circuit breaker.

In FIG. 3 a long arcing time is illustrated, which will provide a sufficient contact distance for a contact pair of a circuit breaker at current interruption, preventing reigniting of the arc. The current I through the circuit breaker is illustrated as a function of time. The circuit breaker is during opening moved from a closed position to an open position. In order to have a safety margin, preventing reigniting an arc, the contact distance at the open position should be longer than the contact distance at current interruption. When the contact pair is opened, contact separation is achieved and an arc will ignite. The time until the next zero crossing, or more precisely the next current interruption, is the arcing time $t_{arc}$.

Figure 4:
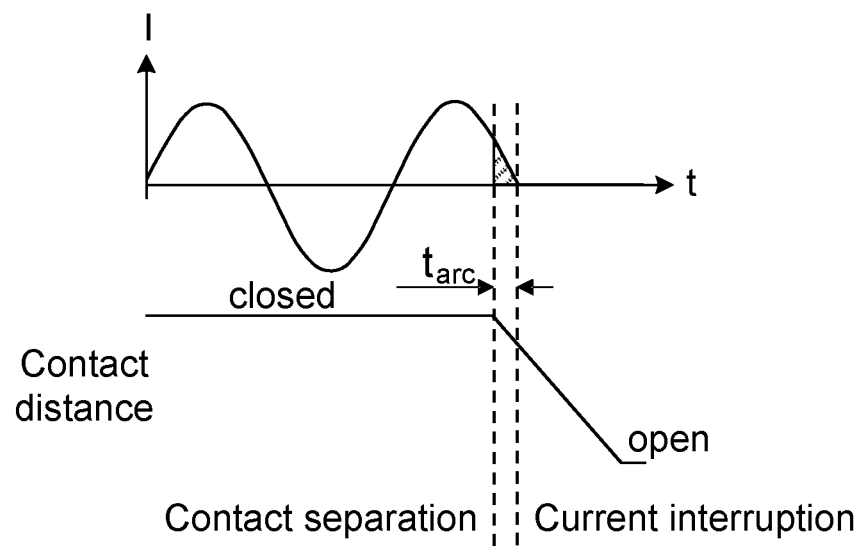

In FIG. 4 a short arcing time is illustrated, which will give a too short contact distance at current interruption, which will risk reigniting the arc.

It is desirable to achieve contact separation of the contact pair of a phase sufficiently long time before a zero crossing of the current in the phase, to minimize overvoltage in the system. Contact separation of the phase should be achieved sufficiently long before the current interruption, such that the circuit breaker has had time to achieve sufficient contact separation before the current interruption occurs. Contact separation is preferably achieved at least 1 ms before the current interruption for e.g. a 50 Hz system or 60 Hz system.

If no synchronization is performed, the arcing time will be different in each operation, i.e. random. If the circuit breaker contacts start to separate very close to the current zero crossing, the arc will burn until the next zero crossing. This means that the shortest arcing time that can be achieved is larger than 0 ms, about 1-2 ms, and the longest arcing time that can be achieved is larger than half the period. Half the period is 10 ms in a 50 Hz system and 8.3 ms in a 60 Hz system. Maximum arcing times that can be achieved are thus in the range of 11-12 ms and 9.3-10.3 ms, respectively. Thus, for a non-synchronized circuit breaker, it is expected that the average arcing time is in the range of 6-7 ms in a 50 Hz system, and 5-6 ms in a 60 Hz system.

The circuit breaker contact wear is related to the arcing time. In a first approximation, the circuit breaker contact wear is proportional to the arc energy which is proportional to the integral of the current over time during the presence of the arc, when the voltage is assumed to be constant. Thus, the contact wear increases with increasing arcing time and limiting the arcing time will limit the contact wear. Synchronizing with a certain arcing time, which is long enough to always avoid reigniting an arc, is beneficial as long as it is shorter than the average arcing time obtained without synchronization. The arcing time, $t_{arc}$, should thus be between 1-7 ms for a 50 or 60 Hz system.

Tests have been made on a non-synchronized circuit breaker in a power system, to calculate the probability of reigniting an arc as a function of the power factor (cos φ), see Table 1. In total 331 opening events were investigated. The number of opening events with power factor below 0.8 is small, and they have therefore been grouped together for a power factor of 0.5-0.8. The number of opening events where reigniting the arc occurred is also reported and the relative number of opening events where reigniting the arc occurred is calculated. This verifies that opening without occurrence of reigniting the arc is more difficult to achieve at lower power factors compared to at higher power factors.

TABLE 1

| Power factor cos φ | total number of opening events | opening events reigniting an arc | % |
|---|---|---|---|
| 0.5-0.8 | 16 | 7 | 44 |
| 0.8-0.9 | 145 | 46 | 32 |
| 0.9-1 | 170 | 44 | 26 |
| Total | 331 | 97 | 29 |

Simulations have been made for a system that generates 25 kA short circuit current with a time constant of 0.045 seconds in a 60 Hz system. The dielectric withstand capability of the contact pairs of the circuit breaker is assumed to increase by 20 kV/ms.

The smallest arcing times required to avoid overvoltage that exceed the withstand capability of the contact pair of the circuit breaker (CB) for the different power factors are summarized in Table 2. As can be seen in table 2 the required minimum arcing time is longer the smaller the power factor is.

TABLE 2

| Power factor cos φ | Required minimum arcing time to avoid reigniting an arc [ms] | Delay CB opening from current zero crossing [ms] | Delay CB opening from voltage zero crossing [ms] | Time lag between voltage and current [ms] | Additional arcing time |
|---|---|---|---|---|---|
| 0.5 | 3.4 | 4.9 | 7.7 | 2.8 | 0 |
| 0.9 | 1.7 | 6.6 | 7.8 | 1.2 | 0.1 |
| 1.0 | 0.4 | 7.9 | 7.9 | 0 | 0.2 |

The additional arcing time in the right most column indicates the exaggeration of the arcing time when the phase-to-ground voltage is used as reference signal instead of when the current is used as reference signal. The delay time for power factor 0.5 may be chosen for all power factors when only voltage measurements are available as a reference signal and the power factor is unknown.

Another simulation was also performed, where the increase in dielectric withstand of the circuit breaker is 15 kV/ms (instead of 20 kV/ms), obtaining the results in Table 3. Choosing the arcing time according to the lowest power factor in this case implies a more severe exaggeration of arcing time for higher power factors, compared to the circuit breaker dielectric withstand of 20 kV/ms. When only the voltage is available as reference signal and the power factor is unknown the arcing time may be chosen according to the lowest power factor.

TABLE 3

| Power factor | Required minimum arcing time to avoid reigniting an arc [ms] | Delay CB opening from current zero crossing [ms] | Delay CB opening from voltage zero crossing [ms] | Time lag between voltage and current [ms] | Additional arcing time |
|---|---|---|---|---|---|
| 0.5 | 4.5 | 3.8 | 6.6 | 2.8 | 0 |
| 0.9 | 2.3 | 6.0 | 7.2 | 1.2 | 0.6 |
| 1.0 | 0.5 | 7.8 | 7.8 | 0.0 | 1.2 |

Utilizing both voltage and current measurements to determine the power factor of circuit breaker will enable minimum arcing times to be targeted, offering maximum endurance. Utilizing only voltage measurements will however still increase the endurance significantly as compared to running unsynchronized.

When both voltage and current sensors are available in the system, the power factor may thus be calculated before each opening operation. A target value of arcing time (required minimum) should then be set according to the power factor, and a certain delay from the current zero crossing should be added before sending an opening command to the circuit breaker, in order to achieve contact separation at the desired instant, i.e. giving the targeted arcing time.

When only voltage sensors are available, the voltage signal can still be used as reference, but it is not possible to calculate the power factor. If the value of the power factor is anyhow known beforehand in a specific site or for a specific application the relation between phase angle of voltage and current is known, and sending of the opening command can be related to the phase angle of the voltage which gives the correct arcing time. The power factor may e.g. be known based on experience, and will for the control device be predetermined. If the value of the power factor is not known, a fixed or predetermined value of delay is added to the detected voltage zero crossing, before sending an opening command to the circuit breaker. The predetermined value of delay may then be chosen to cover all power factors for the inductive load. To cover all possible power factors without reigniting an arc, the delay needs to be chosen according to the worst case, i.e. the lowest power factor and the longest arcing time. In this way, the arcing time used in all cases but the worst case, will be exaggerated to a certain extent. In the simulations performed above, this effect may be minor, as can be seen in column 4 in Table 2. Yet another option is to choose a delay that will likely cause reigniting an arc for the worst cases but not for the larger power factors, in order to achieve less contact wear on average. The delay may be predetermined by e.g. measured in an installation or may be defined for certain types of circuit breaker (which have a well-known speed of contact movement).

Figure 5A:
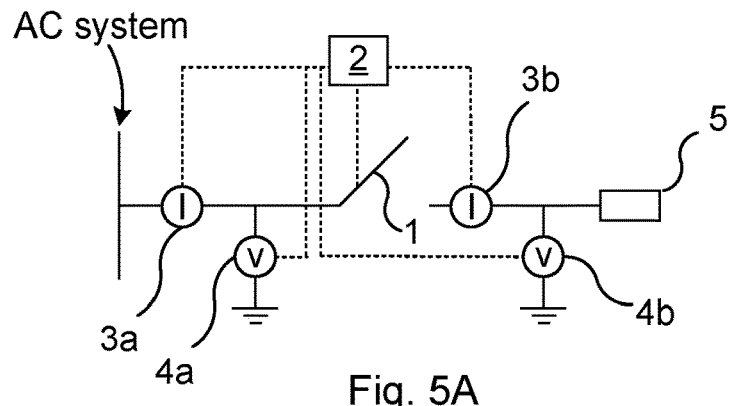
FIGS. 5A and 5B are schematic diagrams illustrating circuit breakers connected between an AC system and a load.

An embodiment of a circuit breaker arrangement is presented with reference to FIG. 5A. The circuit breaker arrangement comprises a circuit breaker 1, a control device 2, and one or more sensor devices 3, 4. The circuit breaker 1 is connected between an AC system and an inductive load 5. The inductive load 5 is connected/disconnected to the AC system by the circuit breaker 1. The circuit breaker is controlled by the control device 2.

The circuit breaker is configured to interrupt a current of the purely or partly inductive load 5.

The control device 2 is configured to measure a reference signal as a function of time for the circuit breaker 1. The control device 2 is configured to obtain an indication of a power factor of the inductive load through the circuit breaker. The control device 2 is configured to determine an arcing time for opening of the circuit breaker, the arcing time being dependent on the obtained indication of a power factor. The control device is configured to predict a zero crossing of the current through the circuit breaker based on the measured reference signal. The control device is configured to provide contact separation of a contact pair of the circuit breaker at a point of time before the predicted zero crossing. The point of time is determined by the determined arcing time and the predicted zero crossing.

The reference signal may be a phase-to-ground voltage for the circuit breaker 1 or a current through the circuit breaker 1. The voltage may be measured upstream the circuit breaker 1 with a sensor device 4a, or downstream the circuit breaker 1 with a sensor device 4b. The current may be measured upstream the circuit breaker 1 with a sensor device 3a, or downstream the circuit breaker 1 with a sensor device 3b.

The power factor can be calculated as the cosine of the phase angle between the measured current and the measured phase-to-ground voltage.

The value of the power factor is between 0 and 1, inductive, meaning that the current lags the phase-to-ground voltage.

When the current through the circuit breaker is measured as a reference signal, contact separation can precisely be initiated at a point of time that occurs as long time before a predicted current zero crossing as a desired or targeted arcing time.

When only the phase-to-ground voltage is measured at the circuit breaker as a reference signal, the current zero crossing can be predicted based on the predicted voltage zero crossing if the power factor is known. For an inductive load, the current zero crossing occurs a period of time after the phase-to-ground voltage zero crossing which is equal to the function arccosine(power factor)/(2*π*f). The frequency f can either be predetermined e.g. known by having been plugged in to the control system or can be estimated based on the reference signal. Contact separation can then be initiated at a point of time that occurs as long time before a predicted current zero crossing as the desired or targeted arcing time.

The reference signal may alternatively be a phase-to-phase voltage for the circuit breaker. The phase-to-phase voltage may be measured upstream the circuit breaker 1 with a sensor device 4a, or downstream the circuit breaker 1 with a sensor device 4b. The phase-to-ground voltage is then obtained through the well-known relationship u12=u1−u2 where u12 is a phase-to-phase voltage and u1 and u2 are phase to ground voltages. This gives a phase displacement where u1 is leading u12 by 30 degrees and u2 is lagging u12 by 30 degrees.

When only the phase-to-ground or phase-to-phase voltage is measured as a reference signal and the power factor is not known, contact separation can be initiated at a point of time that occurs as long time before a predicted or targeted phase-to-ground voltage zero crossing as the desired arcing time. The achieved arcing time will then be larger than the targeted one due to the delay of the current zero crossing with regards to the voltage zero crossing, according to the function described above. The time difference between phase-to-ground voltage and current zero crossing is larger the larger the power factor is.

Figure 5B:
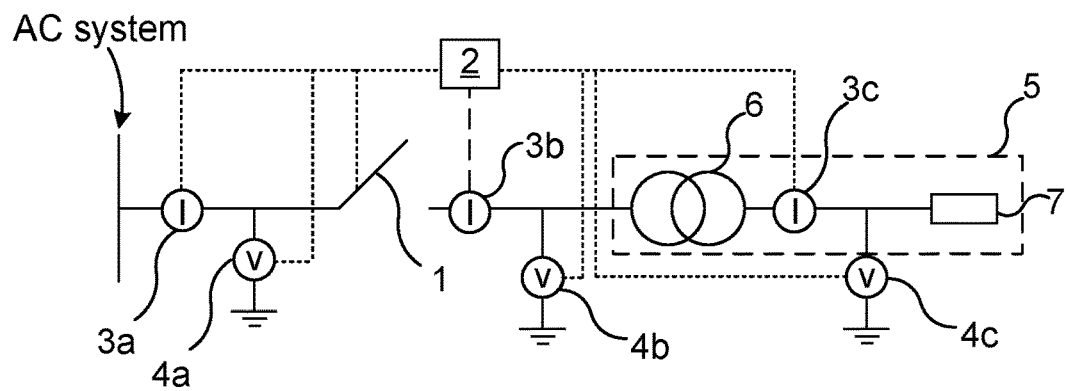

Another embodiment of a circuit breaker arrangement is presented with reference to FIG. 5B. FIG 5B comprises the same components as the embodiment illustrated in connection with FIG. 5A, apart from the following.

From the circuit breaker 1 point of view, the whole system 5, downstream the circuit breaker 1, is regarded as the inductive load of the circuit breaker. The inductive load 5 now comprises a transformer 6 connected to an inductive load 7 (such as an arc furnace). The complete inductive load 5 is to be connected/disconnected to the AC system by the circuit breaker 1. The current through the circuit breaker 1 may now further be estimated by measuring the current between the transformer 6 and the inductive load 7, with a sensor device 3c. The phase-to-ground or phase-to-phase voltage at the circuit breaker 1 may now further be estimated by measuring the phase-to-ground or phase-to-phase voltage between the transformer 6 and the inductive load 7.

When the phase-to-ground voltage and current are only measured downstream the transformer (3c and 4c), the power factor of the power through the circuit breaker can be estimated based on these measurements and the phase displacement by the transformer. The phase displacement induced by the transformer may e.g. be determined by performing measurements in an installation or may be defined for certain types of transformers (which have a well-known phase displacement). When the phase-to-phase voltage is measured downstream the transformer, the phase angle of the phase-to-ground voltage downstream the transformer can be calculated as mentioned before and the power factor of the power through the circuit breaker can thereafter be estimated.

When only the voltage or current is only measured downstream the transformer (3c or 4c) the same approach as in the case of FIG. 5A can be utilized, by compensating for the phase displacement for the transformer.

Contact separation in the circuit breaker 1 needs to occur a certain time before a zero crossing of the current through the circuit breaker. When the current through the circuit breaker is directly measured, the determination is directly evident. When the voltage upstream or downstream the circuit breaker is measured, and the power factor is known, the voltage and the power factor may be used to determine the current through the circuit breaker. When measurements are made downstream the transformer, the relation to voltages and currents upstream the transformer is further needed. I.e. phase shifts introduced by the transformer are also needed to be taken into account, to know the phase angle of the current through the circuit breaker and the power factor of the power through the circuit breaker.

Figure 6:
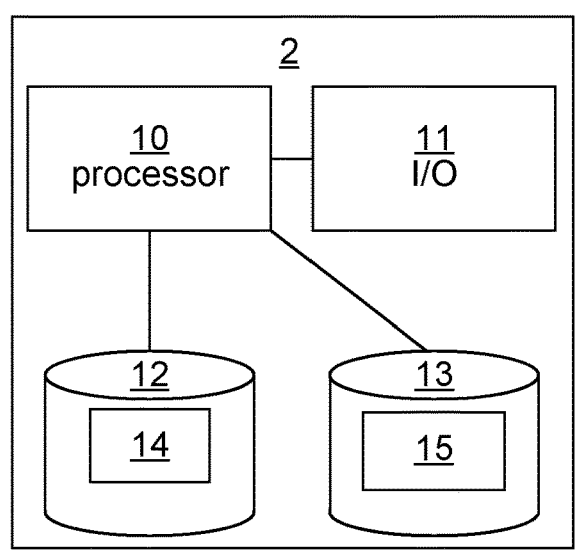
FIG. 6 is a schematic diagram illustrating come components of a control device presented herein.

According to an aspect, an embodiment of a control device for synchronized opening of a circuit breaker is presented with reference to FIG. 6. The circuit breaker is arranged to interrupt a current to an inductive load. The control device 2 comprises a processor 10, and a computer program product 12, 13 storing instructions that, when executed by the processor, causes the control device to measure a reference signal as a function of time for a circuit breaker 1 connected to an inductive load 5, obtain an indication of a power factor of the inductive load through the circuit breaker, determine an arcing time for opening of the circuit breaker, the arcing time being dependent on the obtained indication of a power factor, predict a zero crossing of a current through the circuit breaker based on the measured reference signal, and to provide contact separation of a contact pair of the circuit breaker at a point of time before the predicted zero crossing, the point of time is determined by the determined arcing time and the predicted zero crossing.

FIG. 6 is a schematic diagram showing some components of the control device 6. The processor or processing circuitry 10 may be provided using any combination of one or more of a suitable central processing unit, CPU, multiprocessing circuitry, microcontroller, digital signal processing circuitry, DSP, application specific integrated circuit etc., capable of executing software instructions of a computer program 14 stored in a memory. The memory can thus be considered to be or form part of the computer program product 12. The processing circuitry 10 may be configured to execute methods described herein with reference to FIG. 1.

The memory may be any combination of read and write memory, RAM, and read only memory, ROM. The memory may also comprise persistent storage, which, for example, can be any single one or combination of magnetic memory, optical memory, solid state memory or even remotely mounted memory.

A second computer program product 13 in the form of a data memory may also be provided, e.g. for reading and/or storing data during execution of software instructions in the processing circuitry 10. The data memory can be any combination of read and write memory, RAM, and read only memory, ROM, and may also comprise persistent storage, which, for example, can be any single one or combination of magnetic memory, optical memory, solid state memory or even remotely mounted memory. The data memory may e.g. hold other software instructions 15, to improve functionality for the control device.

The network centric process control system may further comprise an input/output (I/O) interface ii including e.g. a user interface. The control device may further comprise a receiver configured to receive signalling from other devices, and a transmitter configured to transmit signalling to other devices (not illustrated). Other components of the control device are omitted in order not to obscure the concepts presented herein.

According to an aspect, an embodiment of a computer program for synchronizing opening of a circuit breaker is presented with reference to FIG. 6. The circuit breaker is arranged to interrupt a current to an inductive load. The computer program 14, 15 comprises computer program code which, when run in a control device 2, causes the control device to measure a reference signal as a function of time for a circuit breaker 1 connected to an inductive load 5, obtain an indication of a power factor of the inductive load through the circuit breaker, to determine an arcing time for opening of the circuit breaker, the arcing time being dependent on the obtained indication of a power factor, predict a zero crossing of a current through the circuit breaker based on the measured reference signal, and to provide contact separation of a contact pair of the circuit breaker at a point of time before the predicted zero crossing, the point of time is determined by the determined arcing time and the predicted zero crossing.

A computer program product comprising a computer program 14, 15 and a computer readable storage means 12, 13 on which the computer program is stored is also presented.

The aspects of the present disclosure have mainly been described above with reference to a few embodiments and examples thereof. However, as is readily appreciated by a person skilled in the art, other embodiments than the ones disclosed above are equally possible within the scope of the invention, as defined by the appended patent claims.

The invention claimed is:

1. A method for synchronizing opening of a circuit breaker, the circuit breaker being arranged to interrupt a current to an inductive load, the method being performed in a control device and comprising:
    measuring a reference signal as a function of time for the circuit breaker connected to the inductive load;
    obtaining an indication of a power factor of the inductive load through the circuit breaker;
    choosing a value of a targeted arcing time for opening of the circuit breaker, the value of the targeted arcing time being chosen based on the obtained indication of the power factor;
    predicting a zero crossing of a current through the circuit breaker based on the measured reference signal; and
    providing contact separation of a contact pair of the circuit breaker at a point of time before the predicted zero crossing, the point of time being determined by the determined arcing time and the predicted zero crossing.

2. The method according to claim 1, wherein the arcing time is determined to be shorter for a higher power factor and longer for a lower power factor.

3. The method according to claim 2, wherein the reference signal is the current through the circuit breaker.

4. The method according to claim 2, wherein the power factor is obtained by measuring the current through the circuit breaker and measuring a phase-to-phase or phase-to-ground voltage at the circuit breaker.

5. The method according to claim 2, wherein the reference signal is a phase-to-ground or phase-to-phase voltage at the circuit breaker, and wherein a value of the power factor is predetermined.

6. The method according to claim 1, wherein the reference signal is the current through the circuit breaker.

7. The method according to claim 1, wherein the power factor is obtained by measuring the current through the circuit breaker and measuring a phase-to-phase or phase-to-ground voltage at the circuit breaker.

8. The method according to claim 1, wherein the reference signal is a phase-to-ground or phase-to-phase voltage at the circuit breaker, and wherein a value of the power factor is predetermined.

9. The method according to claim 1, wherein the reference signal is measured upstream of the circuit breaker.

10. The method according to claim 1, wherein the reference signal is measured downstream the circuit breaker.

11. The method according to claim 1, wherein the circuit breaker is configured for a medium voltage system.

12. The method according to claim 1, wherein the circuit breaker is configured for an arc-furnace.

13. The method according to claim 1, wherein the circuit breaker is a vacuum circuit breaker.

14. The method according to claim 1, wherein the arcing time is determined to be $t_0(1-pf)^{1/3}$, wherein pf is the value of the power factor, and $t_0$ is the value of the arcing time for the power factor equal to zero.

15. The method according to claim 14, wherein $t_0$ is between 3 and 7 ms.

16. The method according to claim 1, wherein the arcing time is determined to be at least 1 ms.

17. A control device for synchronizing opening of a circuit breaker arranged to interrupt a current to an inductive load, the control device comprising:
    a processor; and
    a computer program product storing instructions that, when executed by the processor, causes the control device to:
        measure a reference signal as a function of time for the circuit breaker connected to the inductive load;
        obtain an indication of a power factor of the inductive load through the circuit breaker;
        choosing a value of a targeted arcing time for opening of the circuit breaker, the value of the targeted arcing time being chosen based on the obtained indication of the power factor;
        predict a zero crossing of a current through the circuit breaker based on the measured reference signal; and
        provide contact separation of a contact pair of the circuit breaker at a point of time before the predicted zero crossing, the point of time being determined by the determined arcing time and the predicted zero crossing.

18. A circuit breaker arrangement for synchronizing opening of a circuit breaker, comprising:

a circuit breaker configured to interrupt a current to an inductive load connected to the circuit breaker; and a control device configured to control the circuit breaker, and including:

a processor; and a computer program product storing instructions that, when executed by the processor, causes the control device to:

measure a reference signal as a function of time for the circuit breaker connected to the inductive load;

obtain an indication of a power factor of the inductive load through the circuit breaker;

choosing a value of a targeted arcing time for opening of the circuit breaker, the value of the targeted arcing time being chosen based on the obtained indication of the power factor;

predict a zero crossing of a current through the circuit breaker based on the measured reference signal; and provide contact separation of a contact pair of the circuit breaker at a point of time before the predicted zero crossing, the point of time being determined by the determined arcing time and the predicted zero crossing.

19. A computer program for synchronizing opening of a circuit breaker arranged to interrupt a current to an inductive load, the computer program stored on a non-transitory computer readable medium and comprising computer program code which, when run in a control device, causes the control device to:

measure a reference signal as a function of time for the circuit breaker connected to the inductive load;

obtain an indication of a power factor of the inductive load through the circuit breaker;

choose a value of a targeted arcing time for opening of the circuit breaker, the value of the targeted arcing time being chosen based on the obtained indication of the power factor;

predict a zero crossing of a current through the circuit breaker based on the measured reference signal; and provide contact separation of a contact pair of the circuit breaker at a point of time before the predicted zero crossing, the point of time being determined by the determined arcing time and the predicted zero crossing.

\* \* \* \* \*